US008994450B2

(12) United States Patent
Zhang et al.

(10) Patent No.: US 8,994,450 B2
(45) Date of Patent: Mar. 31, 2015

(54) DOHERTY POWER AMPLIFIER, AND METHOD AND DEVICE FOR IMPROVING POWER AMPLIFICATION EFFICIENCY OF DOHERTY POWER AMPLIFIER

(71) Applicant: Huawei Technologies Co., Ltd., Shenzhen, Guangdong (CN)

(72) Inventors: Xikun Zhang, Chengdu (CN); Yawen Zhang, Shanghai (CN); Song Li, Chengdu (CN); Qiao Wu, Kista (SE); Xuekun Li, Shanghi (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/289,295

(22) Filed: May 28, 2014

(65) Prior Publication Data
US 2014/0306765 A1   Oct. 16, 2014

Related U.S. Application Data

(63) Continuation of application No. PCT/CN2012/085433, filed on Nov. 28, 2012.

(30) Foreign Application Priority Data

Nov. 28, 2011   (CN) .......................... 2011 1 0384862

(51) Int. Cl.
*H03F 3/18*   (2006.01)
*H03F 3/24*   (2006.01)
(Continued)

(52) U.S. Cl.
CPC .............. *H03F 3/245* (2013.01); *H03F 1/0288* (2013.01); *H03F 1/0272* (2013.01); *H03F 3/211* (2013.01); *H03F 2200/18* (2013.01); *H03F 2203/21106* (2013.01)
USPC ...................................... 330/124 R; 300/295

(58) Field of Classification Search
CPC ........................................................ H03F 3/68

USPC ................................ 330/295, 124 R, 84, 126
See application file for complete search history.

(56) References Cited

U.S. PATENT DOCUMENTS 6,262,629 B1   7/2001   Stengel et al.
7,262,656 B2 *  8/2007   Shiikuma .................. 330/124 R
(Continued)

FOREIGN PATENT DOCUMENTS

CN   1741373 A   3/2006
CN   1805273 A   7/2006
(Continued)

OTHER PUBLICATIONS

Lee et al., "Highly Linear and Efficient Asymmetrical Doherty Power Amplifiers with Adaptively Bias-controlled Predistortion Drivers," Microwave Symposium Digest, 2009. MTT '09. IEEE MTT-S International, pp. 1393-1396, Institute of Electrical and Electronics Engineers, New York, New York (Jun. 7-12, 2009).

*Primary Examiner* — Henry Choe
(74) *Attorney, Agent, or Firm* — Leydig, Voit & Mayer, Ltd.

(57) ABSTRACT

One aspect of the present invention provides a method for improving power amplification efficiency of a Doherty power amplifier. The method is applied to a Doherty power amplifier that has two paths of Doherty circuit units connected in parallel. The method includes: when output power of the Doherty power amplifier is within a low out power range, adjusting, by a bias circuit, gate voltages of main power amplifiers and peak power amplifiers in the two paths of Doherty circuit units connected in parallel, in order to cause the peak power amplifiers to be in an off state, and the main power amplifiers in the two paths of Doherty circuit units connected in parallel to be in a main power amplification state and a peak power amplification state respectively.

8 Claims, 5 Drawing Sheets

(51) Int. Cl.
*H03F 1/02* (2006.01)
*H03F 3/21* (2006.01)

(56) References Cited

U.S. PATENT DOCUMENTS

| | | | | |
|---|---|---|---|---|
| 7,301,395 | B2* | 11/2007 | Mobbs | 330/124 R |
| 7,466,760 | B2* | 12/2008 | Sorrells et al. | 375/294 |
| 8,581,665 | B2* | 11/2013 | Ui | 330/295 |
| 8,736,364 | B2* | 5/2014 | Hayakawa et al. | 330/124 R |

| | | | |
|---|---|---|---|
| 2006/0044060 | A1 | 3/2006 | Shikuma |
| 2010/0045385 | A1 | 2/2010 | Pengelly |

FOREIGN PATENT DOCUMENTS

| | | |
|---|---|---|
| CN | 101087161 A | 12/2007 |
| CN | 201230300 Y | 4/2009 |
| CN | 102064774 A | 5/2011 |
| CN | 102427332 A | 4/2012 |
| JP | 2008206106 A | 9/2008 |
| WO | WO 2008053534 A1 | 5/2008 |

* cited by examiner

DOHERTY POWER AMPLIFIER, AND METHOD AND DEVICE FOR IMPROVING POWER AMPLIFICATION EFFICIENCY OF DOHERTY POWER AMPLIFIER

CROSS-REFERENCE TO RELATED APPLICATIONS

This application is a continuation of International Patent Application No. PCT/CN2012/085433, filed on Nov. 28, 2012, which claims priority to Chinese Patent Application No. 201110384862.5, filed on Nov. 28, 2011, both of which are hereby incorporated by reference in their entireties.

TECHNICAL FIELD

The present invention relates to the field of communications technologies, and in particular, to a Doherty power amplifier, and a method and device for improving power amplification efficiency of a Doherty power amplifier.

BACKGROUND

With the continuous promotion of ideas of green environmental protection and low carbon economy around the world, operators have increasingly higher requirements for reducing power consumption in wireless communications systems. In a wireless communications system, a radio frequency power amplifier (power amplifier for short) in a base station device is one of core modules of the entire system. An important indicator of the radio frequency power amplifier is power amplification efficiency. Data analysis indicates that in an entire base station device, energy consumption of a radio frequency power amplifier accounts for about 60% of total energy consumption; and therefore improving power amplification efficiency of the power amplifier becomes the most effective way for reducing power consumption of the base station device and reducing operating expenses of operators.

A Doherty (Doherty) power amplifier is currently a most widely applied high-power power amplifier technology in a wireless communications system. A conventional Doherty power amplifier includes: a main power amplifier, a peak power amplifier, and the like. A basic idea of the conventional Doherty power amplifier is active load pull, which is specifically: The main power amplifier operates in class B or class AB, and the peak power amplifier operates in class C; and each of the two amplifiers bears different input signal power, so that the two power amplifiers both operate in their own saturation regions as much as possible, thereby ensuring that the entire power amplifier maintains relatively high efficiency within an input signal power range as large as possible, and ensuring certain linearity.

However, the inventor finds in researches that in a case where the main power amplifier is biased in class AB, the peak power amplifier is biased in class C, and an impedance transformation relationship is unchanged, the conventional Doherty power amplifier can adjust a drain voltage or a gate voltage in time according to a system service volume, so as to improve efficiency of the power amplifier when power is low; however, according to an actual measurement, when peak power backs off by 12 dB, that is, when output power of the conventional Doherty power amplifier is within a low out power range, an improvement in power amplification efficiency brought about by the foregoing method is less than 10%. Therefore, how to improve power amplification efficiency of a Doherty power amplifier working in a low out power range still has a significant meaning for saving energy and reducing consumption for an entire base station device.

SUMMARY

Embodiments of the present invention provides a Doherty power amplifier, and a method and device for improving power amplification efficiency of a Doherty power amplifier, which can reduce power consumption of a Doherty power amplifier working in a low out power range, and improve power amplification efficiency of the Doherty power amplifier.

One embodiment of the present invention provides a method for improving power amplification efficiency of a Doherty power amplifier. The method is applied to a Doherty power amplifier that has two paths of Doherty circuit units connected in parallel, where each Doherty circuit unit includes a main power amplifier and a peak power amplifier, and the main power amplifier and the peak power amplifier are connected in parallel. The method includes: when output power of the Doherty power amplifier is within a low out power range, adjusting, by a bias circuit, gate voltages of main power amplifiers and peak power amplifiers in the two paths of Doherty circuit units connected in parallel, in order to cause the peak power amplifiers to be in an off state, and the main power amplifiers in the two paths of Doherty circuit units connected in parallel to be in a main power amplification state and a peak power amplification state respectively.

Another embodiment of the present invention provides a Doherty power amplifier, including: two Doherty circuit units connected in parallel, where each Doherty circuit unit includes a main power amplifier and a peak power amplifier, and the main power amplifier and the peak power amplifier are connected in parallel.

An embodiment of the present invention further provides a bias circuit, where the bias circuit is connected to a Doherty power amplifier. The Doherty power amplifier has two paths of Doherty circuit units connected in parallel, where each Doherty circuit unit includes a main power amplifier and a peak power amplifier, and the main power amplifier and the peak power amplifier are connected in parallel. The bias circuit is separately connected to gates of the main power amplifiers and the peak power amplifiers, and the bias circuit includes: a receiving module, configured to receive a control command that is sent by a control circuit, where the control command includes values of gate voltages required by the main power amplifiers and the peak power amplifiers in the Doherty power amplifier; and a gate voltage adjusting module, connected to the gates of the main power amplifiers and the peak power amplifiers, and configured to adjust gate voltages of the main power amplifiers and the peak power amplifiers in the Doherty power amplifier according to the values of the gate voltages required by the main power amplifiers and the peak power amplifiers in the Doherty power amplifier.

An embodiment of the present invention further provides a Doherty power amplifier apparatus, including: a Doherty power amplifier and a bias circuit.

An embodiment of the present invention further provides a Doherty power amplifier apparatus, including a Doherty power amplifier, a bias circuit, and a control circuit. The Doherty power amplifier includes two Doherty circuit units connected in parallel, where each Doherty circuit unit includes a main power amplifier and a peak power amplifier, and the main power amplifier and the peak power amplifier are connected in parallel; the control circuit is configured to detect output power when the two main power amplifiers in the Doherty power amplifier operate in a main power amplification state and the two peak power amplifiers operate in a peak power amplification state, and send a control command to the bias circuit according to the output power; and the bias circuit is configured to receive the control command that is sent by the control circuit, and adjust gate voltages of the main power amplifiers and the peak power amplifiers in the Doherty power amplifier according to the control command.

An embodiment of the present invention further provides a base station, including a Doherty power amplifier apparatus.

An embodiment of the present invention further provides a communications system, including a base station that includes a Doherty power amplifier.

An embodiment of the present invention further provides a method for improving power amplification efficiency of a Doherty power amplifier. The method is applied to a Doherty power amplifier that has two paths of Doherty circuit units connected in parallel, where each Doherty circuit unit includes a main power amplifier and a peak power amplifier, and the main power amplifier and the peak power amplifier are connected in parallel. The method includes: detecting, by a control circuit, output power when the two main power amplifiers in the Doherty power amplifier operate in a main power amplification state and the two peak power amplifiers operate in a peak amplification state, and sending a control command to a bias circuit according to the output power; and receiving, by the bias circuit, the control command, and adjusting gate voltages of the main power amplifiers and the peak power amplifiers in the two paths of Doherty circuit units connected in parallel according to the control command.

It can be seen from the foregoing technical solutions that, the method for improving power amplification efficiency of a Doherty power amplifier provided by the present invention is applied to a Doherty power amplifier that has two paths of Doherty circuit units connected in parallel, where each Doherty circuit unit includes a main power amplifier and a peak power amplifier, and the main power amplifier and the peak power amplifier are connected in parallel; and gate voltages of main power amplifiers and peak power amplifiers in the two paths of Doherty circuit units connected in parallel can be adjusted by a bias circuit, in order to cause the Doherty power amplifier to operate in different scenarios according to a requirement, for example, the peak power amplifiers are in an off state, and the main power amplifiers in the two paths of Doherty circuit units connected in parallel are in a main power amplification state and a peak power amplification state respectively, thereby achieving an objective of reducing power consumption of the Doherty power amplifier working in a low out power range and improving power amplification efficiency of the Doherty power amplifier.

DESCRIPTION OF EMBODIMENTS

Figures 1, 2:
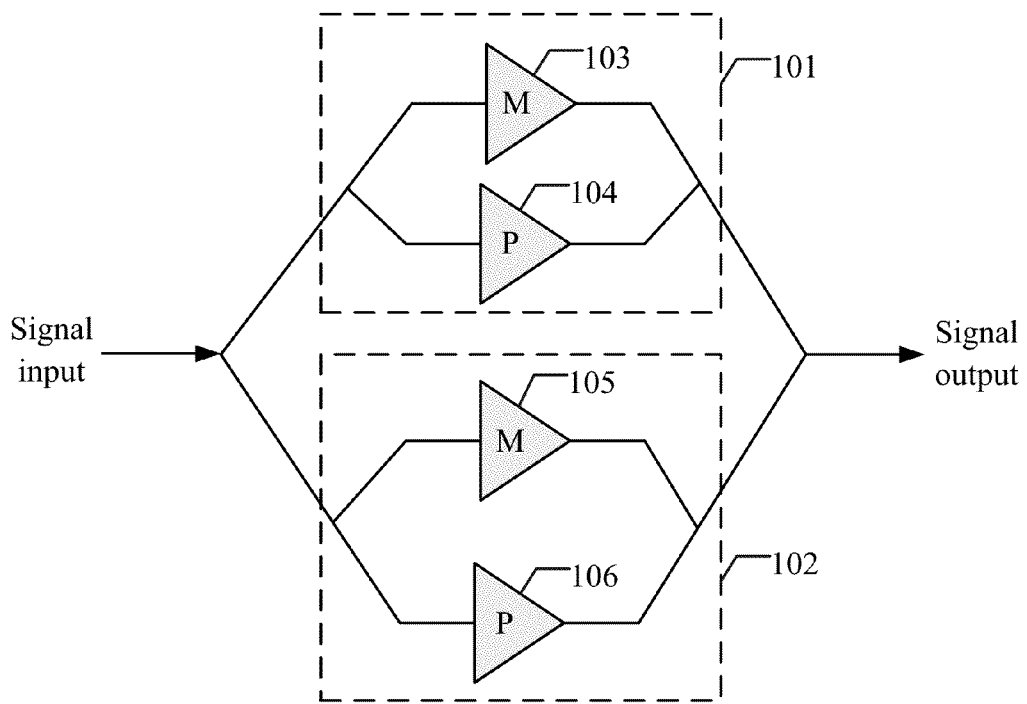
FIG. 1 is a structural diagram of a Doherty power amplifier according to an embodiment of the present invention.
FIG. 2 is a schematic diagram of a method for improving power amplification efficiency of a Doherty power amplifier according to an embodiment of the present invention.

Embodiments of the present invention provide a Doherty power amplifier, and a method and device for improving power amplification efficiency of a Doherty power amplifier, which can effectively reduce power consumption of a Doherty power amplifier working in a low out power range, and improve power amplification efficiency of the Doherty power amplifier.

A Doherty power amplification structure is formed of two power amplifiers: a main power amplifier and an auxiliary power amplifier, where the main power amplifier operates in class B or class AB, and the auxiliary power amplifier operates in class C. The two power amplifiers do not operate alternately; instead, the main power amplifier operates all the time, and the auxiliary power amplifier does not operate until a set peak value is reached. A quarter-wave line connected behind the main power amplifier is used for performing impedance transformation, with a purpose of playing a role of reducing apparent impedance of the main power amplifier when the auxiliary power amplifier operates, thereby ensuring that when the auxiliary power amplifier operates, impedance of an active load that is formed of the auxiliary power amplifier and the circuit at the behind becomes lower, so that an output current of the main power amplifier becomes larger. Because the quarter-wave line exists behind the main power amplifier, in order that outputs of the two power amplifiers are in a same phase, a phase shift of 90° is also required in front of the auxiliary power amplifier.

The main power amplifier operates in class B. When an input signal is relatively small, only the main power amplifier is in an operating state; and when an output voltage of a tube reaches a peak saturation point, efficiency can reach 78.5% theoretically. If drive doubles in this case, the output voltage of the tube is saturated when reaching half of a peak value, and efficiency also reaches a maximum of 78.5%. In this case, the auxiliary power amplifier starts to operate together with the main power amplifier (class C, a threshold is set to half of a drive signal voltage). Introduction of the auxiliary power amplifier reduces a load from the perspective of the main power amplifier, and because an effect of the auxiliary power amplifier on the load is equivalent to negative impedance connected in series, even if the output voltage of the main power amplifier is saturated and constant, output power continuously increases due to the reduction of the load impedance (a current flowing through the load impedance becomes larger). When a peak value of the drive is reached, maximum efficiency of the auxiliary power amplifier is also achieved. In this way, combined efficiency of the two power amplifiers is far greater than efficiency of a single class B power amplifier. The maximum efficiency of 78.5% of a single class B power amplifier appears at the peak value, but now the efficiency of 78.5% appears at half of the peak value. Therefore, this type of system structure can reach very high efficiency (each amplifier reaches a maximum output efficiency).

FIG. 1 shows an embodiment of a Doherty power amplifier in the embodiments of the present invention, where M represents a main power amplifier and P represents a peak power amplifier, and the Doherty power amplifier includes:

a first Doherty circuit unit 101 and a second Doherty circuit unit 102 connected in parallel, where the first Doherty circuit unit 101 includes a first main power amplifier 103 and a first peak power amplifier 104, and the first main power amplifier 103 and the first peak power amplifier 104 are connected in parallel; and the second Doherty circuit unit 102 includes a second main power amplifier 105 and a second peak power amplifier 106, where the second main power amplifier 105 and the second peak power amplifier 106 are connected in parallel.

It should be noted that in the embodiment of the present invention, power amplifiers in the Doherty power amplifier are connected by microstrip lines and in a way that conforms to a matching principle for the microstrip lines in the Doherty power amplifier. In an actual application, a type of a microstrip line in use may be determined according to a specific situation, and is not limited herein. In addition, an impedance matching network or a phase modulation network may exist in the Doherty power amplifier in the embodiment of the present invention according to an actual situation, which may be implemented according to an existing principle and technology, and details are not repeatedly described herein.

It should be noted that in the embodiment of the present invention, power amplifiers with different power may be used as the first main power amplifier 103, the first peak power amplifier 104, the second main power amplifier 105, and the second peak power amplifier 106 in the Doherty power amplifier according to a specific requirement on power. For example, both the first Doherty circuit unit and the second Doherty circuit unit may be set as symmetrical Doherty power amplifiers, or both the first Doherty circuit unit and the second Doherty circuit unit may be set as asymmetrical Doherty power amplifiers. Therefore, power values of the power amplifiers in the Doherty power amplifier are not limited herein.

In the embodiment of the present invention, gates of the first main power amplifier 103, the first peak power amplifier 104, the second main power amplifier, and the second peak power amplifier are all connected to a bias circuit, so that when output power of the Doherty power amplifier is within a low out power range, the bias circuit adjusts gate voltages of the main power amplifiers and the peak power amplifiers in the Doherty power amplifier, in order to cause the two peak power amplifiers to be in an off state, and the two main power amplifiers to be in a main power amplification state and a peak power amplification state respectively, thereby achieving an objective of reducing power consumption and improving power amplification efficiency. The main power amplification state refers to a state in which a power amplifier operates in class B or class AB, and the peak power amplification state refers to a state in which a power amplifier operates in class C. In an embodiment of the present invention, FIG. 2 shows an embodiment of a method for improving power amplification efficiency of a Doherty power amplifier in the embodiments of the present invention, where the method is applied to the Doherty power amplifier shown in FIG. 1, and includes:

201: When output power of the Doherty power amplifier is within a low out power range, receive, by a bias circuit, a control command that is sent by a control circuit, where the control command includes values of gate voltages currently required by the main power amplifiers and the peak power amplifiers.

In the embodiment of the present invention, the control circuit can detect output power of the Doherty power amplifier in real time, where the output power may be instantaneous output power or average output power of the Doherty power amplifier. The control circuit determines, according to the output power of the Doherty power amplifier, parameters about the values of the gate voltages currently required by the main power amplifiers and the peak power amplifiers in the Doherty power amplifier, carries values of the parameter in the control command, and sends the control command to the bias circuit. Therefore, when the output power of the Doherty power amplifier is within a low out power range, the bias circuit receives the control command that is sent by the control circuit, where the control command includes the values of the gate voltages required by the main power amplifiers and the peak power amplifiers in the Doherty power amplifier. That output power of the Doherty power amplifier is within a low out power range refers to: when the two main power amplifiers in the Doherty power amplifier operate in a main power amplification state and the two peak power amplifiers operate in a peak amplification state, a power output is less than a preset value. The preset value may be determined according to a system requirement by a manner of analog simulation and the like.

It should be noted that in the embodiment of the present invention, after power values of the first main power amplifier 103, the first peak power amplifier 104, the second main power amplifier 105, and the second peak power amplifier 106 in the Doherty power amplifier are determined, values of gate voltages required by the main power amplifiers and the peak power amplifiers in the Doherty power amplifier when the Doherty power amplifier reaches relatively high power amplification efficiency in a case of different output power may be determined by a manner of analog simulation. Therefore, when the control circuit detects current output power of the Doherty power amplifier, the control circuit can determine parameters about the values of the gate voltages currently required by the main power amplifiers and the peak power amplifiers in the Doherty power amplifier.

202: Regulate gate voltages of the main power amplifiers and the peak power amplifiers according to the values of the gate voltages currently required by the main power amplifiers and the peak power amplifiers.

In the embodiment of the present invention, when output power of the Doherty power amplifier is within a low output power range, gate voltages of the first main power amplifier 103, the first peak power amplifier 104, the second main power amplifier 105, and the second peak power amplifier 106 in the first Doherty circuit unit 101 and the second Doherty circuit unit 102 in the Doherty power amplifier are adjusted by the bias circuit; a specific adjusting manner is as follows: receiving, by the bias circuit, the control command that is sent by the control circuit, where the control command includes the values of the gate voltages currently required by the main power amplifiers and the peak power amplifiers; and adjusting the gate voltages of the main power amplifiers and the peak power amplifiers according to the values of the gate voltages currently required by the main power amplifiers and the peak power amplifiers, in order to cause the first peak power amplifier 104 and the second peak power amplifier 106 in the Doherty power amplifier to be in an off state, and the main power amplifier 103 and the main power amplifier 105 to be in a main power amplification state and a peak power amplification state respectively, thereby achieving an objective of reducing power consumption of the Doherty power amplifier working in a low out power range and improving power amplification efficiency of the Doherty power amplifier.

It should be noted that the low out power range in the embodiment of the present invention refers to a power range of corresponding power that is less than a smaller peak point of two peak points in a power amplification efficiency curve of the Doherty power amplifier when the main power amplifiers in the Doherty power amplifier operate in a main power amplification state and the peak power amplifiers operate in a peak power amplification state. For example, if in the efficiency curve of the Doherty power amplifier, peak points appear at power of 0 dB and power of −6 dB, the low output power range of the Doherty power amplifier is an range less than −6 dB. For a better understanding, reference may be made to FIG. 5, which shows an efficiency curve of a symmetrical Doherty power amplifier when total power of the Doherty power amplifier is normalized to 0 dB, main power amplifiers in the Doherty power amplifier operate in a main power amplification state, and peak power amplifiers operate in a peak power amplification state according to an embodiment of the present invention.

An embodiment of the present invention further provides a bias circuit, where the bias circuit is connected to the Doherty power amplifier in the embodiment shown in FIG. 1. The Doherty power amplifier includes: a first Doherty circuit unit 101 and a second Doherty circuit unit 102 connected in parallel, where the first Doherty circuit unit 101 includes a first main power amplifier 103 and a first peak power amplifier 104, and the first main power amplifier 103 and the first peak power amplifier 104 are connected in parallel; and the second Doherty circuit unit 102 includes a second main power amplifier 105 and a second peak power amplifier 106, and the second main power amplifier 105 and the second peak power amplifier 106 are connected in parallel. Specifically, the bias circuit is connected to gates of the first main power amplifier 103, the first peak power amplifier 104, the second main power amplifier 105, and the second peak power amplifier 106, and is configured to adjust gate voltages of the main power amplifiers and the peak power amplifiers when output power of the Doherty power amplifier is within a low out power range, in order to cause the two peak power amplifiers to be in an off state, and the two main power amplifiers to be in a main power amplification state and a peak power amplification state respectively.

Figure 3:
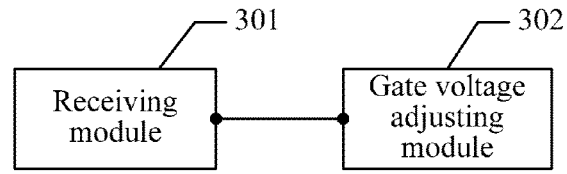
FIG. 3 is a schematic diagram of a bias circuit according to an embodiment of the present invention.

FIG. 3 shows an embodiment of a bias circuit in the embodiments of the present invention, where the bias circuit includes:

a receiving module 301, configured to receive a control command that is sent by a control circuit, where the control command includes values of gate voltages required by main power amplifiers and peak power amplifiers in a Doherty power amplifier; and a gate voltage adjusting module 302, separately connected to gates of the main power amplifiers and the peak power amplifiers, and configured to adjust gate voltages of the main power amplifiers and the peak power amplifiers in the Doherty power amplifier according to the values of the gate voltages required by the main power amplifiers and the peak power amplifiers in the Doherty power amplifier.

Further, the receiving module 301 may be configured to receive the control command that is sent by the control circuit when the control circuit detects that output power is less than a preset value, where the control command includes values of gate voltages required for turning off the peak power amplifiers in the Doherty power amplifier, and values of gate voltages required for keeping the two main power amplifiers in the Doherty power amplifier in a main power amplification state and a peak power amplification state respectively; and the gate voltage adjusting module 302 may be configured to adjust the gate voltages of the peak power amplifiers and the main power amplifiers in the Doherty power amplifier according to the received control command, in order to cause the peak power amplifiers to be in an off state, and the two main power amplifiers in the Doherty power amplifier to be in a main power amplification state and a peak power amplification state respectively.

The bias circuit in the embodiment of the present invention can effectively adjust gate voltages of the Doherty power amplifier, so that the Doherty power amplifier operates in different scenarios, and when output power of the Doherty power amplifier is within a low out power range, the two peak power amplifiers in the Doherty power amplifier are in an off state, and the two main power amplifiers are in a main power amplification state and a peak power amplification state respectively, thereby achieving an objective of reducing power consumption of the Doherty power amplifier and improving power amplification efficiency.

Figure 4:
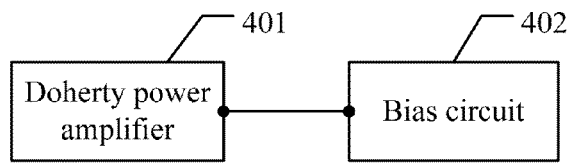
FIG. 4 is a schematic diagram of a Doherty power amplifier apparatus according to an embodiment of the present invention.

FIG. 4 shows an embodiment of a Doherty power amplifier apparatus in the embodiments of the present invention, where the Doherty power amplifier apparatus includes:

a Doherty power amplifier 401 shown in FIG. 1 and a bias circuit 402 shown in FIG. 3.

In the embodiment of the present invention, the bias circuit 402 receives a control command that is sent by a control circuit, where the control command may include values of gate voltages required by main power amplifiers and peak power amplifiers in the Doherty power amplifier, so that the bias circuit 402 can adjust gate voltages of the Doherty power amplifier. Further, when output power of the Doherty power amplifier is within a low out power range, power consumption of the Doherty power amplifier can be effectively reduced, and power amplification efficiency can be improved.

Further, the Doherty power amplifier apparatus in the embodiment of the present invention may further include the control circuit, where:

the control circuit is configured to detect output power when the two main power amplifiers in the Doherty power amplifier operate in a main power amplification state and the two peak power amplifiers operate in a peak amplification state, and send the control command to the bias circuit according to the output power; and the bias circuit 402 is configured to receive the control command that is sent by the control circuit, and adjust gate voltages of the main power amplifiers and the peak power amplifiers in the Doherty power amplifier according to the control command The control circuit may be further configured to send the control command to the bias circuit when the output power is less than a preset value, where the control command includes values of gate voltages required for turning off the peak power amplifiers in the Doherty power amplifier, and values of gate voltages required for keeping the two main power amplifiers in the Doherty power amplifier in a main power amplification state and a peak power amplification state respectively.

The bias circuit 402 may be further configured to receive the control command, and adjust the gate voltages of the peak power amplifiers and the main power amplifiers in the Doherty power amplifier according to the control command, in order to cause the peak power amplifiers to be in an off state, and the two main power amplifiers in the Doherty power amplifier to be in a main power amplification state and a peak power amplification state respectively.

It should be noted that in the embodiment of the present invention, the Doherty power amplifier in the embodiment shown in FIG. 4 may be applied to a base station, and a base station that includes the Doherty power amplifier apparatus in the embodiment shown in FIG. 4 may be applied to a communications system.

In the embodiment of the present invention, the Doherty power amplifier is formed of two Doherty circuit units connected in parallel, where a Doherty circuit unit includes a main power amplifier and a peak power amplifier connected in parallel, to form a new type of Doherty power amplifier.

When output power of the Doherty power amplifier is within a low out power range, gate voltages of the main power amplifiers and the peak power amplifiers in the Doherty power amplifier are adjusted by the bias circuit, in order to cause the peak power amplifiers in the Doherty power amplifier to be in an off state, and the two main power amplifiers to be in a main power amplification state and a peak power amplification state respectively. By using an operating principle of the Doherty power amplifier, power amplification efficiency of the Doherty power amplifier working in a low out power range can be effectively improved, and power consumption can be reduced.

For a better understanding of the Doherty power amplifier in the present invention, the following uses specific operating scenarios to show that in the embodiment of the present invention, the objective of reducing power consumption and improving power amplification efficiency can be achieved by the bias circuit to adjust the gate voltages of the Doherty power amplifier.

Using a case where the first main power amplifier 103, the first peak power amplifier 104, the second main power amplifier 105, and the second peak power amplifier 106 in the Doherty power amplifier have same power, and total output power of the Doherty power amplifier is normalized to 0 dB as an example, operating scenario 1 and operating scenario 2 of the Doherty power amplifier are respectively as follows:

Operating scenario 1: The gate voltages of the first main power amplifier 103 and the second main power amplifier 105 are adjusted by the bias circuit, in order to cause the first main power amplifier 103 and the second main power amplifier 105 to operate in a main power amplification state; and the gate voltages of the first peak power amplifier 104 and the second peak power amplifier 106 are set, in order to cause the first peak power amplifier 104 and the second peak power amplifier 106 to operate in a peak power amplification state.

Figure 5:
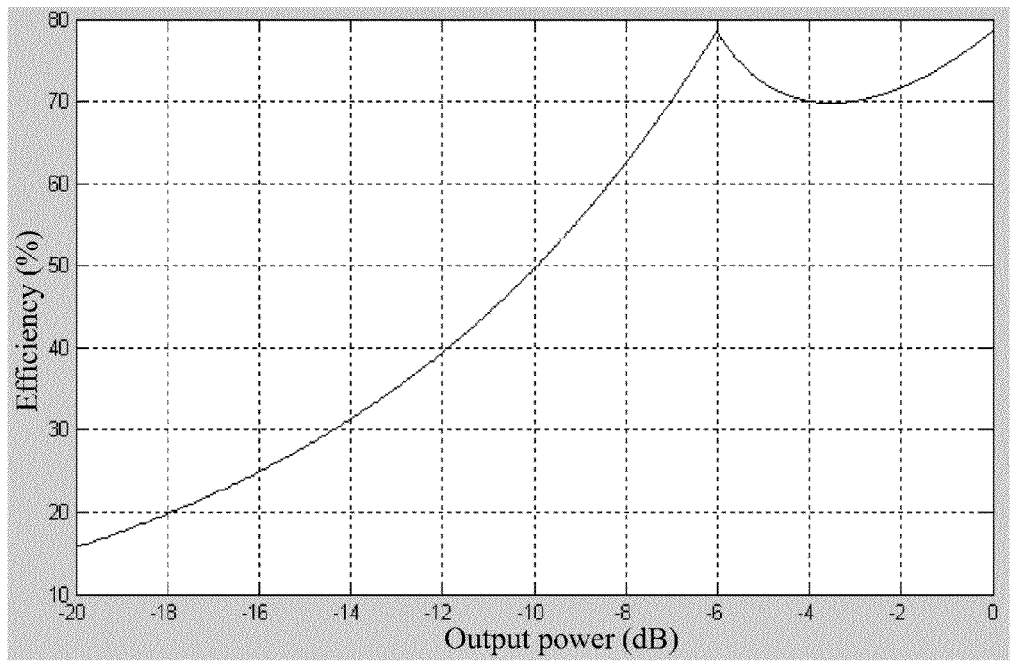
FIG. 5 is an efficiency curve of a Doherty power amplifier according to an embodiment of the present invention.

In a case of the foregoing operating scenario 1, according to the operating principle of the Doherty power amplifier, the first main power amplifier 103 and the second main power amplifier 105 in the Doherty power amplifier operate in an impedance range from 100 ohms to 50 ohms; the first peak power amplifier 104 and the second peak power amplifier 106 operate in an impedance range from infinite impedance to 50 ohms; and the first Doherty circuit unit 101 and the second Doherty circuit unit 102 operate independently, and after an input signal passes through the two Doherty circuit units, power combination is performed at an output end, and an amplified input signal is output to a load. FIG. 5 shows an efficiency curve of the Doherty power amplifier in the case of operating scenario 1, where a horizontal axis represents output power of the Doherty power amplifier, and a vertical axis represents power amplification efficiency of the Doherty power amplifier.

Operating scenario 2: The gate voltages of the first main power amplifier 103, the second main power amplifier 105, the first peak power amplifier 104, and the second peak power amplifier 106 are set by the bias circuit, in order to cause the first main power amplifier 103 to operate in a peak power amplification state, the second main power amplifier 105 to operate in a main power amplification state, and the first peak power amplifier 104 and the second peak power amplifier 106 to be in an off state.

In a case of operating scenario 2, the first main power amplifier 103 and the second main power amplifier 105 form a new two-way symmetrical power amplifier; and according to the operating principle of the Doherty power amplifier, the first main power amplifier 103 operates in an impedance range from 200 ohms to 100 ohms, the second main power amplifier 105 operates in an impedance range from infinite impedance to 100 ohms, and because the first peak power amplifier 104 and the second peak power amplifier 106 are in an off state, an output end presents an open-circuit feature and does not affect circuit features of the first main power amplifier 103 or the second main power amplifier 105.

Figure 6:
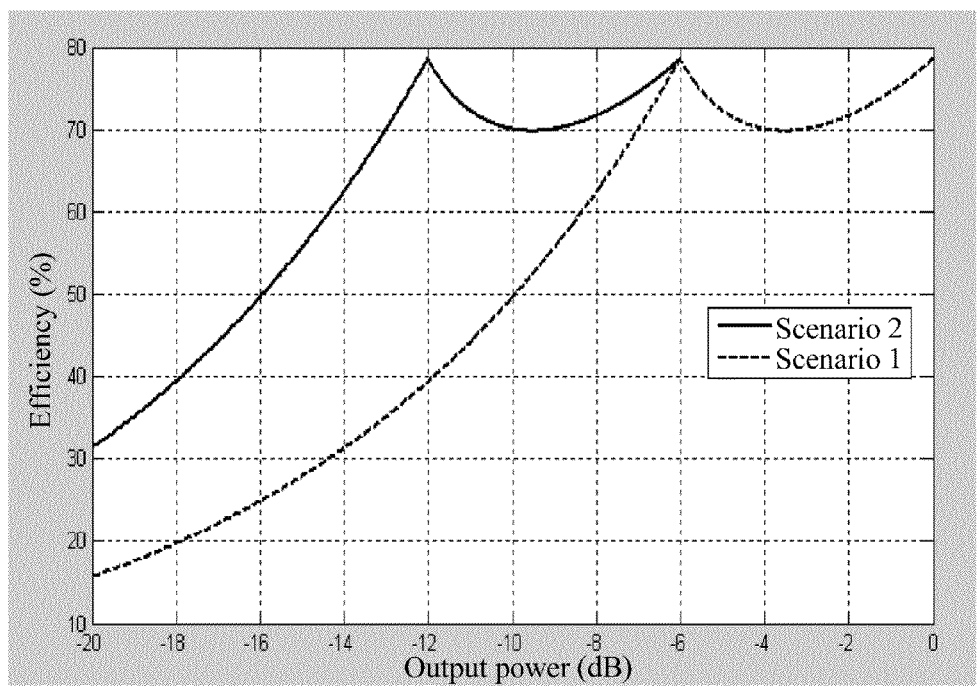
FIG. 6 is an efficiency curve of a Doherty power amplifier according to an embodiment of the present invention.

Saturation power of the Doherty power amplifier in operating scenario 2 is 6 dB less than normalized reference power in operating scenario 1, and peak points of power amplification efficiency appear at −12 dB and −6 dB. FIG. 6 shows an efficiency curve diagram of the Doherty power amplifier in both operating scenario 2 and operating scenario 1, where a horizontal axis represents output power of the Doherty power amplifier, and a vertical axis represents power amplification efficiency of the Doherty power amplifier.

In FIG. 6, efficiency of the Doherty power amplifier within a low out power range (−6 dB and below) is significantly improved, where at a power point of −12 dB, efficiency is improved from about 40% to 78.5%, and at a power point of −20 dB, efficiency is improved from about 15% to about 30%.

Figure 7:
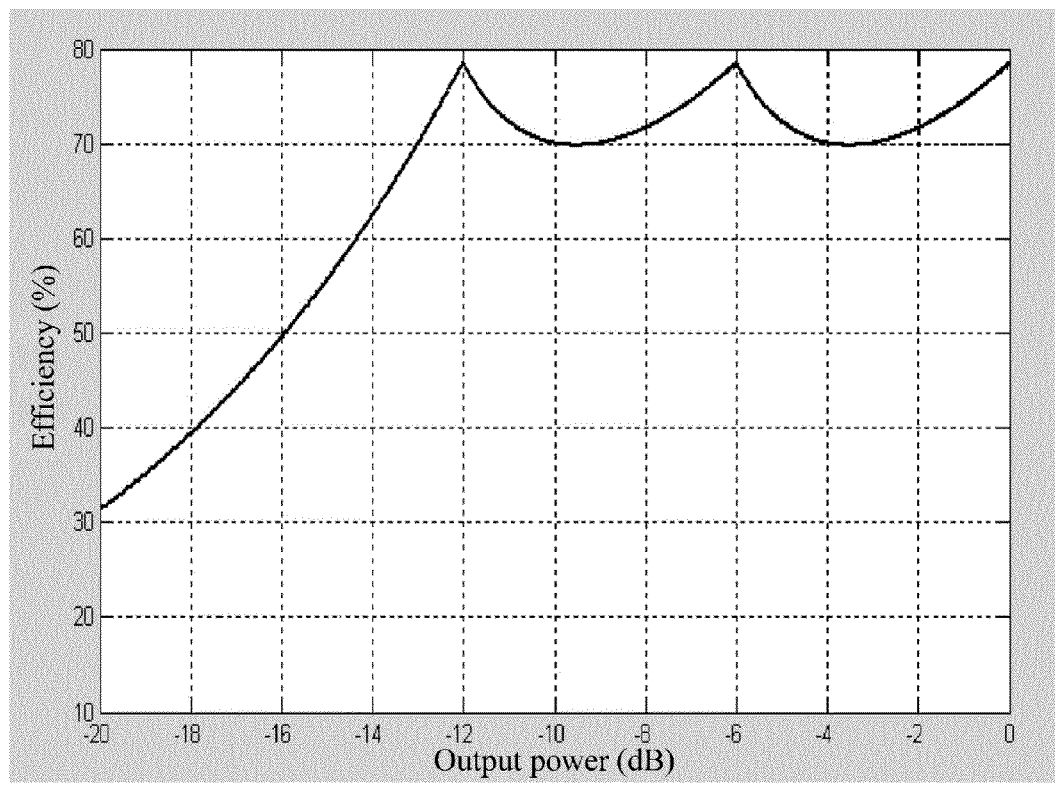
FIG. 7 is an efficiency curve of a Doherty power amplifier according to an embodiment of the present invention.

In actual application, operating scenario 1 and operating scenario 2 may be combined. That is, the gate voltages of the main power amplifiers and the peak power amplifiers in the Doherty power amplifier are adjusted by the bias circuit, so that the Doherty power amplifier operates in different operating scenarios. FIG. 7 shows an efficiency curve of the Doherty power amplifier obtained after operating scenario 1 and operating scenario 2 are combined. When output power of the Doherty power amplifier is within an range from −6 dB to 0 dB, the gate voltages of the power amplifiers in the Doherty power amplifier may be adjusted, in order to cause the main power amplifiers to operate in a main power amplification state, and the peak power amplifiers operate in a peak power amplification state; that is, the gate voltages are adjusted as described in operating scenario 1. When output power of the Doherty power amplifier is less than −6 dB, the gate voltages of the power amplifiers in the Doherty power amplifier may be adjusted, in order to cause the peak power amplifiers to be in an off state, and the two main power amplifiers to be in a main power amplification state and a peak power amplification state respectively; that is, the gate voltages are adjusted as described in operating scenario 2. In this way, power consumption of the output power of the Doherty power amplifier working in a low out power range can be effectively reduced, and power amplification efficiency can be improved.

Figure 8:
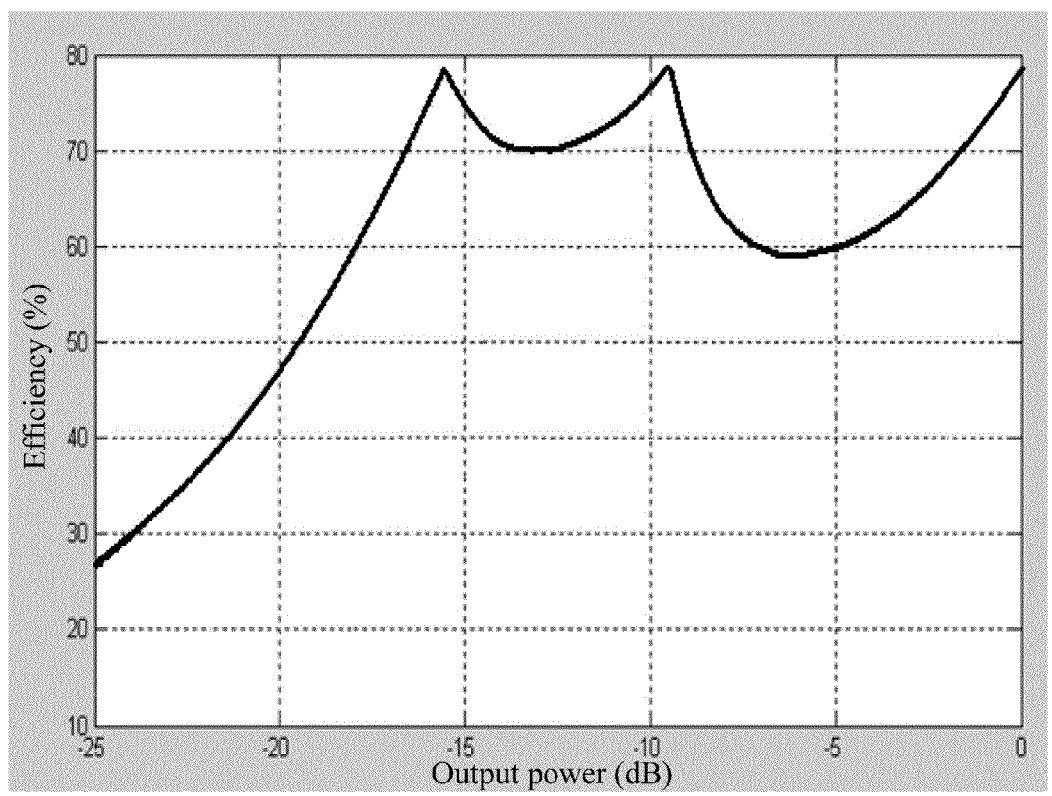
FIG. 8 is an efficiency curve of a Doherty power amplifier according to an embodiment of the present invention.

For better description, a case where the main power amplifier 103 and the main power amplifier 105 of a main Doherty power amplifier in the Doherty power amplifier have same power, the peak power amplifier 104 and the peak power amplifier 106 have same power, the power of the peak power amplifiers is twice the power of the main power amplifiers, and total output power of the Doherty power amplifier is normalized to 0 dB is used as an example to describe an efficiency curve of the Doherty power amplifier in the embodiment of the present invention. FIG. 8 shows an efficiency curve obtained after efficiency curves of the Doherty power amplifier in two operating scenarios are combined.

The efficiency curve from −9.5 dB to 0 dB in FIG. 8 is the efficiency curve of the Doherty power amplifier in operating scenario 1. In operating scenario 1, a power amplifier bias circuit adjusts the gate voltages of the Doherty power amplifier, in order to cause the first main power amplifier 103 and the second main power amplifier 105 to operate in a main power amplification state, and therefore according to the operating principle of the Doherty power amplifier, the first main power amplifier 103 and the second main power amplifier 105 operate in an impedance range from 150 ohms to 50 ohms; and the first peak power amplifier 104 and the second peak power amplifier 106 operate in a peak power amplification state, and therefore the first peak power amplifier 104 and the second peak power amplifier 106 operate in an impedance range from infinite impedance to 50 ohms.

The efficiency curve from −25 dB to −9.5 dB in FIG. 8 is the efficiency curve of the Doherty power amplifier in operating scenario 2. In operating scenario 2, the power amplifier bias circuit adjusts the gate voltages of the Doherty power amplifier, so that the first main power amplifier 103 operates in a peak power amplification state, and therefore the first main power amplifier 103 operates in an impedance range from infinite impedance to 150 ohms; the second main power amplifier 105 operates in a main power amplification state, and therefore the second main power amplifier 105 operates in an impedance range from 300 ohms to 150 ohms; and the first peak power amplifier 104 and the second peak power amplifier 106 are in an off state.

Therefore, in the embodiment of the present invention, the bias circuit can adjust the gate voltages of the Doherty power amplifier, so that the Doherty power amplifier operates in different operating scenarios. In this way, power amplification efficiency of the Doherty power amplifier at a low out power range can be effectively improved.

The foregoing introduces, in detail, the Doherty power amplifier, and the method and the device for improving power amplification efficiency of Doherty power amplifier provided by the present invention. A person of ordinary skill in the art may make variations to the specific implementation manners and application scope according to the ideas of the embodiments of the present invention. Therefore, content of this specification shall not be construed as a limitation on the present invention.

What is claimed is:

1. A method for improving power amplification efficiency of a Doherty power amplifier, wherein the method is applied to the Doherty power amplifier that has two paths of Doherty circuit units connected in parallel, each of the Doherty circuit units comprises a main power amplifier and a peak power amplifier, the main power amplifier and the peak power amplifier are connected in parallel, and the method comprises:
when output power of the Doherty power amplifier is within a low out power range, adjusting, by a bias circuit, gate voltages of main power amplifiers and peak power amplifiers in the two paths of Doherty circuit units connected in parallel, in order to cause the peak power amplifiers to be in an off state, and the main power amplifiers in the two paths of Doherty circuit units connected in parallel to be in a main power amplification state and a peak power amplification state respectively,
wherein the adjusting, by the bias circuit, comprises:
receiving, by the bias circuit, a control command that is sent by a control circuit, wherein the control command comprises values of gate voltages currently required by the main power amplifiers and the peak power amplifiers; and
adjusting gate voltages of the main power amplifiers and the peak power amplifiers according to the values of the gate voltages currently required by the main power amplifiers and the peak power amplifiers.

2. The method according to claim 1, wherein that the output power of the Doherty power amplifier is within the low out power range refers to: when the two main power amplifiers in the Doherty power amplifier operate in the main power amplification state and the two peak power amplifiers operate in a peak power amplification state, the output power is less than a preset value; and
wherein the control command is sent to the bias circuit by the control circuit when the control circuit detects that the output power of the Doherty power amplifier is within the low out power range.

3. A Doherty power amplifier apparatus, comprising a Doherty power amplifier, wherein the Doherty power amplifier comprises two Doherty circuit units connected in parallel, each of the Doherty circuit units comprises a main power amplifier and a peak power amplifier, and the main power amplifier and the peak power amplifier are connected in parallel; and
gates of the main power amplifiers and the peak power amplifiers are all connected to a bias circuit, and when output power of the Doherty power amplifier is within a low out power range, the bias circuit is configured to adjust gate voltages of the main power amplifiers and the peak power amplifiers in the Doherty power amplifier, in order to cause the peak power amplifiers to be in an off state, and the two main power amplifiers in the Doherty power amplifier to be in a main power amplification state and a peak power amplification state respectively,
wherein the Doherty power amplifier apparatus further comprises:
a control circuit, configured to detect the output power when the two main power amplifiers in the Doherty power amplifier operate in the main power amplification state and the two peak power amplifiers operate in the peak amplification state, and send a control command to the bias circuit according to the output power, wherein the control command comprises values of gate voltages required by the main power amplifiers and the peak power amplifiers in the Doherty power amplifier.

4. The Doherty power amplifier apparatus according to claim 3, wherein that the output power of the Doherty power amplifier is within the low out power range refers to: when the two main power amplifiers in the Doherty power amplifier operate in the main power amplification state and the two peak power amplifiers operate in a peak power amplification state, the output power is less than a preset value.

5. The Doherty power amplifier apparatus according to claim 4, wherein the control circuit is further configured to send the control command to the bias circuit when the output power of the Doherty power amplifier is within the low out power range, wherein the control command comprises values of gate voltages required for turning off the peak power amplifiers in the Doherty power amplifier, and values of gate voltages required for keeping the two main power amplifiers in the Doherty power amplifier in the main power amplification state and the peak power amplification state respectively; and
the bias circuit is configured to receive the control command, and adjust the gate voltages of the peak power amplifiers and the main power amplifiers in the Doherty power amplifier according to the control command, in order to cause the peak power amplifiers to be in the off state, and the two main power amplifiers in the Doherty power amplifier to be in the main power amplification state and the peak power amplification state respectively.

6. A base station, comprising a Doherty power amplifier apparatus which comprises a Doherty power amplifier and a bias circuit, wherein the Doherty power amplifier comprises two Doherty circuit units connected in parallel, each of the Doherty circuit units comprises a main power amplifier and a peak power amplifier, and the main power amplifier and the peak power amplifier are connected in parallel; and the bias circuit is connected to gates of the main power amplifiers and the peak power amplifiers, and when output power of the Doherty power amplifier is within a low out power range, the bias circuit is configured to adjust gate voltages of the main power amplifiers and the peak power amplifiers in the Doherty power amplifier, in order to cause the peak power amplifiers to be in an off state, and the two main power amplifiers in the Doherty power amplifier to be in a main power amplification state and a peak power amplification state respectively, wherein the Doherty power amplifier apparatus further comprises: a control circuit, configured to detect the output power when the two main power amplifiers in the Doherty power amplifier operate in the main power amplification state and the two peak power amplifiers operate in the peak power amplification state, and send a control command to the bias circuit according to the output power, wherein the control command comprises values of gate by main power amplifiers and the peak power amplifiers in the Doherty power amplifier.

7. The base station according to claim 6, wherein that the output power of the Doherty power amplifier is within the low out power range refers to: when the two main power amplifiers in the Doherty power amplifier operate in the main power amplification state and the two peak power amplifiers operate in a peak power amplification state, the output power is less than a preset value.

8. The base station according to claim 6, wherein the control circuit is further configured to send the control command to the bias circuit when the output power of the Doherty power amplifier is less than a preset value, the control command comprises values of gate voltages required for turning off the peak power amplifiers in the Doherty power amplifier, and values of gate voltages required for keeping the two main power amplifiers in the Doherty power amplifier in the main power amplification state and the peak power amplification state respectively; and the bias circuit is configured to receive the control command, and adjust the gate voltages of the peak power amplifiers and the main power amplifiers in the Doherty power amplifier according to the control command, in order to cause the peak power amplifiers to be in the off state, and the two main power amplifiers in the Doherty power amplifier to be in the main power amplification state and the peak power amplification state respectively.

* * * * *